United States Patent [19]

Goss et al.

[11] Patent Number: 5,735,983

[45] Date of Patent: Apr. 7, 1998

[54] METHOD FOR MANUFACTURING A PRINTING PLATE

[75] Inventors: William Krebs Goss, Marietta, Ga.; Everett Eugene Garrett, Morristown, Tenn.

[73] Assignee: Polyfibron Technologies, Inc., Atlanta, Ga.

[21] Appl. No.: 669,267

[22] Filed: May 24, 1996

Related U.S. Application Data

[63] Continuation of Ser. No. 111,746, Aug. 25, 1993, abandoned.

[51] Int. Cl.⁶ .................. B32B 31/00; B32B 31/22; B32B 31/30
[52] U.S. Cl. .......... 156/64; 156/153; 156/244.11; 156/244.24; 156/244.27; 156/324
[58] Field of Search .......... 156/64, 243, 244.11, 156/244.24, 246, 153, 244.27, 324; 264/176.1, 177.17, 211.12, 211.13, 211.14, 171.13, 171.24, 171.17; 425/101, 113, 224; 430/270.1, 271.1, 281.1, 286.1, 287.1, 300, 306, 906, 913, 927

[56] References Cited

U.S. PATENT DOCUMENTS

| | | |
|---|---|---|
| 1,892,217 | 12/1932 | Moinrau . |
| 2,154,333 | 4/1939 | Kampfer ............... 156/244.11 |
| 2,788,051 | 4/1957 | Tuttle ................. 156/244.11 |
| 2,901,770 | 9/1959 | Beck ................... 156/244.11 |
| 2,947,598 | 8/1960 | Maragliano et al. ......... 18/54 |
| 2,993,789 | 3/1961 | Crawford ..................... 96/35 |
| 2,994,940 | 8/1961 | Ferrell et al. .......... 156/244.11 |
| 3,157,505 | 11/1964 | Notley et al. ................ 96/68 |
| 3,186,844 | 6/1965 | Alles et al. .................. 96/87 |
| 3,230,127 | 1/1966 | Cleereman et al. ......... 156/244 |
| 3,244,518 | 4/1966 | Schwerin et al. ............. 96/2 |
| 3,264,682 | 8/1966 | Freeman ...................... 18/2 |
| 3,423,493 | 1/1969 | Klenk et al. ............ 264/211.12 |
| 3,560,288 | 2/1971 | Mikami ................. 156/244.11 |
| 3,849,174 | 11/1974 | Ancker .................... 117/65.2 |
| 3,909,265 | 9/1975 | Miyano et al. ................ 96/33 |
| 3,956,056 | 5/1976 | Boguslawski et al. ........ 264/171 |
| 3,990,897 | 11/1976 | Zuerger et al. ................ 96/67 |
| 4,171,193 | 10/1979 | Rahlfs ....................... 425/71 |
| 4,234,676 | 11/1980 | Hein et al. ................. 430/286 |
| 4,298,680 | 11/1981 | Bruno ....................... 430/300 |
| 4,320,188 | 3/1982 | Heinz et al. ............... 430/281 |
| 4,323,636 | 4/1982 | Cen ......................... 430/271 |
| 4,323,637 | 4/1982 | Chen et al. ................ 430/271 |
| 4,345,959 | 8/1982 | Asai et al. .............. 156/244.11 |
| 4,369,246 | 1/1983 | Chen et al. ................ 430/306 |
| 4,403,566 | 9/1983 | Bloothoofd ................. 118/407 |
| 4,426,239 | 1/1984 | Upmeier ................. 156/244.11 |
| 4,427,759 | 1/1984 | Gruetzmacher et al. ...... 430/273 |
| 4,460,675 | 7/1984 | Gruetzmacher et al. ...... 430/300 |
| 4,461,734 | 7/1984 | Jones et al. ................ 264/176 |

(List continued on next page.)

FOREIGN PATENT DOCUMENTS

| | | |
|---|---|---|
| 0614181 | 2/1961 | Canada . |
| A0044600 | 1/1982 | European Pat. Off. . |
| 0456336 | 4/1991 | European Pat. Off. . |
| 5328657 | 1/1978 | Japan . |
| 5606125 | 6/1981 | Japan . |
| 5926220 | 8/1984 | Japan . |
| 6228216 | 3/1987 | Japan . |
| 1002212 | 7/1963 | United Kingdom . |
| A982757 | 2/1965 | United Kingdom . |
| 2024441 | 6/1979 | United Kingdom . |

OTHER PUBLICATIONS

Patent Abstracts of Japan, vol. 10, No. 45, (P–430) (2102) Feb. 21, 1986, regarding "Plate Making Method of Photosensitive Lithographic Plate".

*Primary Examiner*—Richard Crispino
*Attorney, Agent, or Firm*—Woodcock Washburn Kurtz Mackiewicz & Norris LLP

[57] ABSTRACT

An exemplary method for manufacturing a printing plate from photocurable elements comprises the step of extruding a photocurable polymer onto a moving carrier to achieve self-lamination in a nip-free manner.

21 Claims, 5 Drawing Sheets

U.S. PATENT DOCUMENTS

| | | | |
|---|---|---|---|
| 4,469,782 | 9/1984 | Ishiwata et al. | 264/171 |
| 4,478,931 | 10/1984 | Fickes et al. | 430/309 |
| 4,530,896 | 7/1985 | Christensen et al. | 430/155 |
| 4,547,453 | 10/1985 | Worns et al. | 430/271 |
| 4,622,088 | 11/1986 | Min | 156/244.11 |
| 4,663,103 | 5/1987 | McCullough et al. | 264/40.4 |
| 4,675,208 | 6/1987 | Kageyama et al. | 264/176.1 |
| 4,684,568 | 8/1987 | Lou | 428/265 |
| 4,858,139 | 8/1989 | Wirtz | 364/473 |
| 4,871,493 | 10/1989 | Goto | 264/40.6 |
| 5,049,478 | 9/1991 | Koch et al. | 430/270 |
| 5,135,827 | 8/1992 | Bohm et al. | 430/30 |
| 5,167,894 | 12/1992 | Baumgarten | 264/175 |
| 5,176,986 | 1/1993 | Telser et al. | 430/306 |
| 5,236,744 | 8/1993 | Suga et al. | 427/420 |

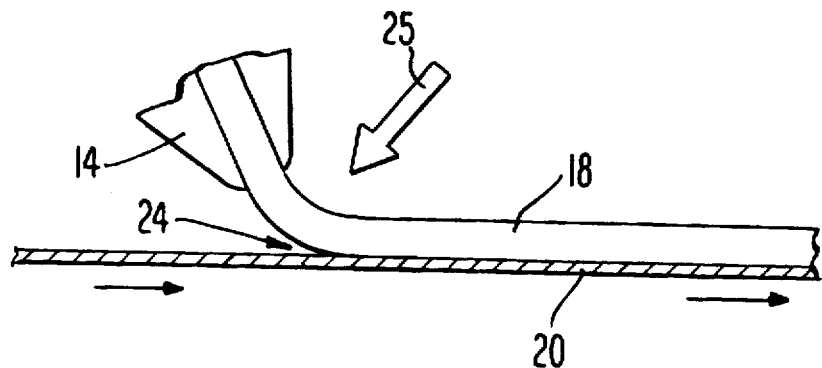
_Fig. 7_
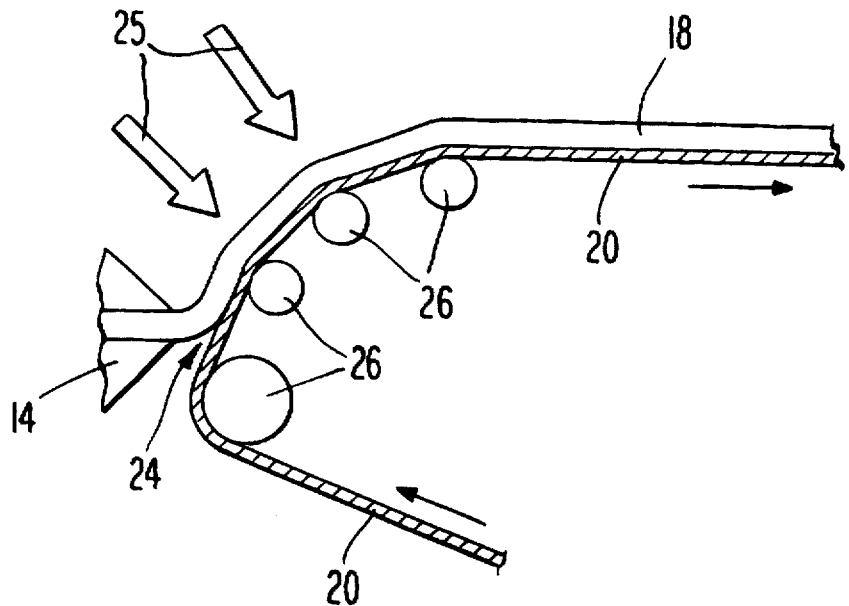
_Fig. 8_

METHOD FOR MANUFACTURING A PRINTING PLATE

This is a continuation, of application Ser. No. 08/111,746, filed Aug. 25, 1993, now abandoned.

BACKGROUND OF THE INVENTION

The present invention relates to a process for the preparation of printing plates, and more particularly to the preparation of flexographic relief image printing plates from photocurable elements.

Printing plates which entail the use of at least one layer formed of a negative-working photocurable composition are exposed through an image-bearing transparency to radiation of an appropriate wave length (commonly termed "actinic" radiation) to cure or harden the composition. The photocurable composition is initially soluble in a chosen developer solvent; but it is rendered insoluble in those areas that are photocured as a result of exposure to actinic radiation. Development of the exposed layer or layers thus removes the composition in non-exposed areas, leaving a relief image defined by the cured composition. The relief image "plate" may then be inked and used to print the image onto substrates such as packaging materials, cartons, and boxes.

One known process for manufacturing printing plates from photocurable compositions involves passing between two sheet supports and into the gap of nipped calendering rolls a hot molten mass of an elastomer binder, monomeric compound, and photoinitiator. The hot polymer mass is calendered into the final shape and thickness of the final printing plate product. Mother printing plate manufacturing process involves extruding the photocurable polymer composition as a thick coating and laminating one side of this coated layer to a releasable cover sheet using nipped laminating cylinders, and thereafter cooling and grinding of the polymer layer, then attaching a support sheet to the ground side.

The use of full-width nipped calendering or laminating rollers, however, creates the risk that particles and foreign matter can be forcibly embedded into the soft polymer. In addition, when molten polymer is passed between nipped rollers, a release agent must be applied to the contacting roller constantly to avoid wrinkling of the polymer layer surface and/or sticking of the polymer to the contacting roller after passing through the nip.

Accordingly, in view of the foregoing disadvantages, a novel process is needed for manufacturing photopolymer printing plates on a continuous basis.

SUMMARY OF THE INVENTION

In surmounting the disadvantages of the prior art, the present invention provides a method for manufacturing printing plates which surprisingly does not require passing a photocurable composition in a molten state between support sheets through nipped calendering or laminating rollers.

One of the purposes and advantages of the invention, therefore, is to provide a photocurable polymer layer operative to self-laminate directly in a nip-free manner to a moving carrier web, such as a peelable multilayer cover sheet, whereby the entrapment of air pockets within the laid-on photocurable polymer sheet, or between the laid-on sheet and the moving carrier, is minimized. This provides the advantage of minimizing or avoiding drop-out areas during printing.

Another purpose and advantage of the invention is to avoid product defects such as may be caused by wrinkling or sticking of the molten-state photocurable polymer layer in the nip between rollers. It is also believed that increased line speeds can be realized by the novel calender-free lamination method of the invention.

It is further believed that, as nipped rollers constrain the freedom of the molten polymer and prevent it from reaching equilibrium prior to cooling, the present invention provides a more uniform printing plate shrinkage during photocuring (ie., height versus width shrinkage of the photocurable polymer layer) since the molten polymer is not quenched in a stressed state otherwise caused by the nip(s) of paired or stacked calendering rollers. Moreover, another purpose and advantage of the present invention is to avoid the so-called "rolling bank" phenomenon which arises when molten polymer becomes a fluid mass build-up in the gap between nipped, rotated cylinders. Such a mass, which potentially "rolls" and can entrain air, but which has often been previously considered necessary for ensuring that sufficient material was available for calendered thicknesses, is entirely avoided by the present invention.

Thus, an exemplary method of the invention for manufacturing a printing element, such as a printing plate, comprises the steps of: extruding a molten polymer sheet which is or will become photocurable, the sheet having major faces extending continuously and coextensively in a portion of the sheet width between opposite sheet edges; and moving a carrier web at a location subsequent to the point of extrusion such that a major face of the extruded polymer sheet, while in a molten state, is self-laminated continuously to the moving carrier.

The self-lamination of the polymer sheet to the moving carrier is nip-free, yet fully-contacted in the sense that no substantial air pockets are formed between the sheet and carrier.

In another exemplary method of the invention, the extrusion of the polymer sheet is performed using a sheet die, and nip-free self-lamination of the photocurable polymer sheet onto the moving carrier is achieved at an angle of at least ninety degrees (i.e., perpendicular) from the center plane of the sheet die opening. In other exemplary methods, lamination of the photocurable polymer sheet occurs by molding the carrier in a direction angled increasingly away from the initial direction of movement at the first laminating contact between the polymer sheet and moving carrier.

Other exemplary methods of the invention further comprise the step of attaching, after the self-lamination of the extruded polymer sheet to the moving carrier, a backing substrate contiguously onto the major side of the photocurable polymer sheet opposite the face that has been self-laminated to the carrier. In further exemplary methods, the self-laminated photocurable polymer sheet is allowed to harden, such as by cooling, thereby permitting grinding of the sheet, before attachment of the contiguous backing substrate, to ensure uniform thickness in the resultant printing plate.

Further advantages and features of the invention are disclosed herein.

BRIEF DESCRIPTION OF THE DRAWINGS

FIGS. 3–8 are partial diagrams of further nip-free self-lamination methods of the invention.

DETAILED DESCRIPTION OF EXEMPLARY EMBODIMENTS

Figure 1:
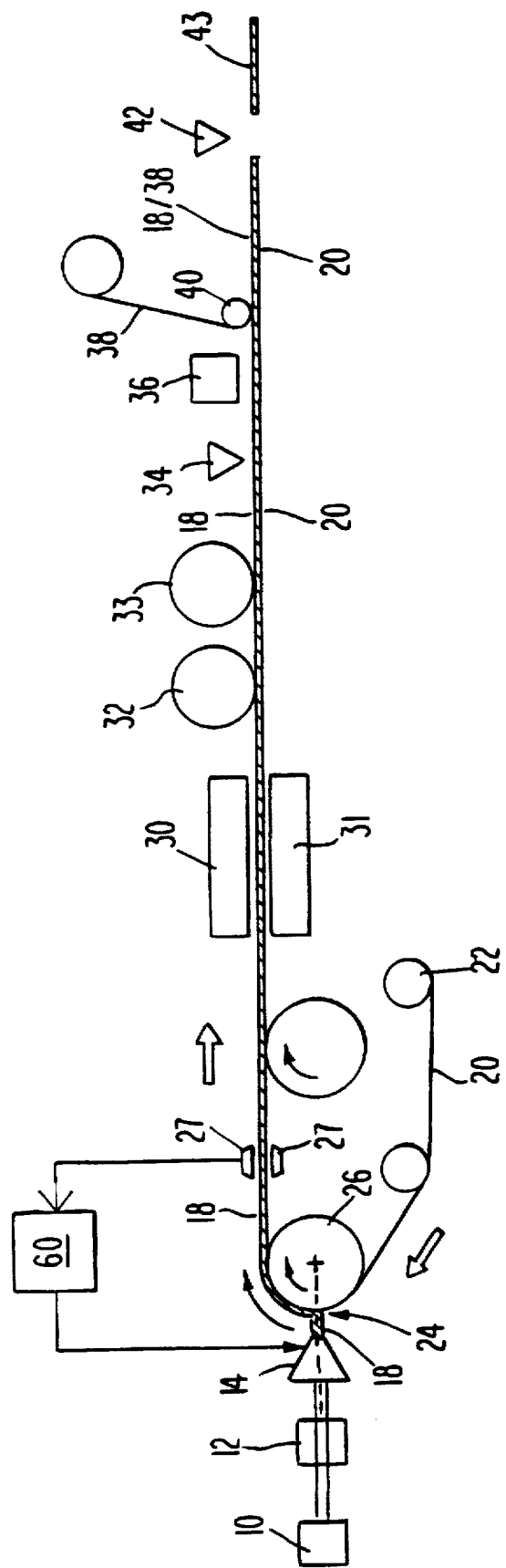
FIG. 1 is a plan diagram of an exemplary nip-free method of the present invention for manufacturing a flexographic printing plate from one or more photocurable elements.

FIG. 1 shows an exemplary nip-free method of the invention for manufacturing a printing plate or printing element wherein a molten or thermally-softened photocurable polymer material is shaped into a sheet form 18 and contiguously self-laminated onto a moving carrier web 20 without the use of nipped, opposed calendering or laminating rollers at the lamination point (as designated at 24). The carrier 20 can be continuously pulled off a roller 22.

By the terms "photocurable polymer" or "photopolymer," as used synonomously herein, it is meant a material or mixture of components which is capable of being extruded when melted or softened and which is considered "photosensitive," "photocurable," or "photoinitiatable" in the sense that portions of the polymer can be made to harden, cross-link, polymerize, cure, or otherwise become resistant to removal by water, solvent, air pressure, or mechanical action when portions of the polymer are subjected to light or radiation during development.

In preferred methods of the invention, the components of the photocurable extrudate sheet 18 are melted in a screw extruder 10 and metered by a metering (or gear) pump 12 to a sheet die 14. This is believed to contribute to ensuring high homogeneity and precise and constant thickness of the photocurable sheet 18. The metering pump 12, preferably of the spur-toothed variety, prevents pulsations generated in the screw extruder 10 from disrupting the smoothness of the polymer being continuously extruded though the sheet die 14 and onto the moving carrier web 20.

Further exemplary methods of the invention comprise the use of a cooling step after the melt extrusion and self-lamination steps, followed by one or more grinding steps to ensure a uniformity of thickness in the polymer sheet 18. An exemplary cooling step may involve exposure of the extruded polymer sheet 18 to ambient temperature. A further exemplary cooling step comprises a forced air cooling device 30 possibly in combination with a conductive cooling device 31, both of which are known in the art. Thermal energy is dissipated from the polymer sheet 18 through the carrier 20 by the conductive device 31. The forced air cooling 30 and conductive cooling 31 are preferably achieved using cooling coils similar to those used in refrigeration units. When sufficiently hardened or solidified, the polymer sheet 18 is advanced to a grinder 32.

The exemplary grinder 32 comprises a cylinder covered with an abrasive sheet such as sandpaper and rotated against the photopolymer sheet preferably in a direction opposite to the direction of sheet travel. The grinding cylinder should preferably be rotatably mounted within a vacuum hood for removing dust particles. An additional grinding cylinder 33 may also be used to ensure thickness uniformity, and a cooling unit may be used between the two grinders 32 and 33. The laminate 18/20 may at this point be cut into separate sheets using scissors, blades, or other known devices 34.

In further exemplary methods, a base or backing layer 38, comprising paper, cellulose film, plastic, metal, or other substrate material, optionally having a pressure-sensitive or hot melt adhesive, is attached to the photopolymer layer 18, such as by using an applicator roll 40, blade, or any other known devices. The applicator roll 40 or blade can be used preferably over or in conjunction with another roller or upon a moving surface, such as a conveyor belt, that preferably has the same speed as the roll 40. It is not necessary that rollers be nipped or even located on opposite sides of the laminate 18/20. A polished steel table or Teflon™ or silicon coated surface can be used, provided the upper and lower surfaces of the laminate can be conveyed at the same speed. Preferably, the surface of the photocurable polymer 18 is subjected to an adhesive applicator 36 for facilitating attachment of the base layer 38, or to flourescent lights, a hot air knife, a microwave emitting device, or other surface heating unit. The laminate 18/38/20 can thereafter be cut 42 using scissors or blades into separate printing plates 43.

Figure 2:
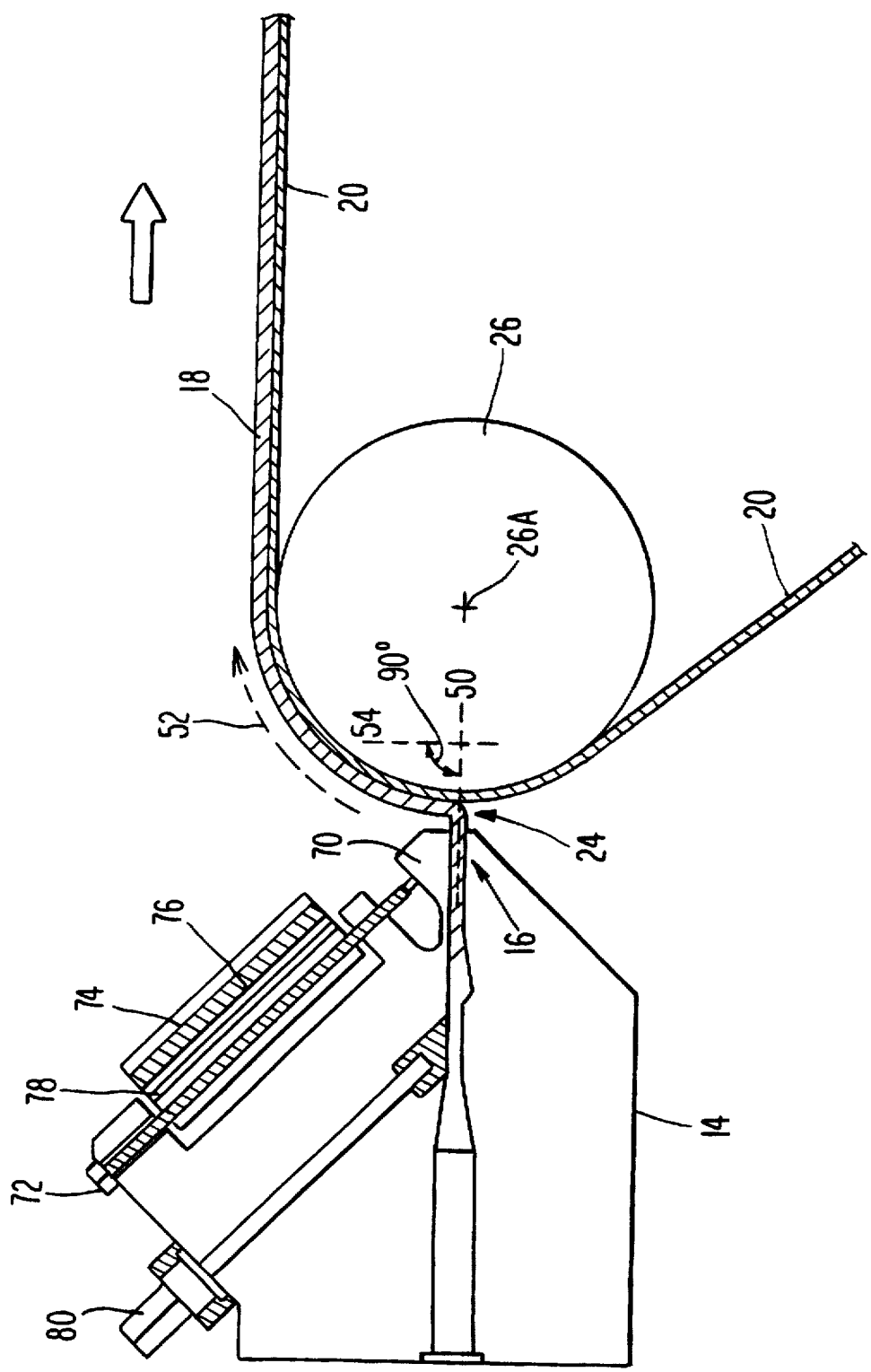
FIG. 2 is an enlarged partial diagram of the exemplary nip-free self-lamination process shown in FIG. 1.

In FIG. 2, there is shown an enlarged partial diagram of an exemplary nip-free self-lamination method. The sheet die 14 should preferably have a continuous lip opening 16 formed by flat, coextensive upper and lower lips which form and shape the photopolymer extrudate 18 into a sheet having uniform thickness. In the outwardmost portion of the opening 16, the upper and lower lips also define a sheet die center plane (designated in cross-section by the dotted line at 50) which may be oriented at an angle of 0–180 degrees, and which should preferably be about 90° (i.e. substantially perpendicular in orientation), with respect to the moving carrier web 20 at the lamination point 24 where the extruded photopolymer sheet 18 is self-laminated to the carrier 20.

In a preferred method of the invention, the nip-free self-lamination of the photocurable extrudate 18 to the moving carrier 20 is achieved by providing a rotatable cylinder 26 for moving the carrier 20 upward and away from the sheet die opening 16.

Preferably, the rotational axis 26A of the cylinder 26 is substantially co-planar with the sheet die center plane 50 denoted by the extended dotted line 50 in FIG. 2. It is possible to attach connectors or adaptors (not shown) between the sheet die 14 and the metering or gear pump 12, whereby the angle of the sheet die 14 can be altered with respect to the moving carrier 20. Alternatively, the sheet die 14 can be lowered or elevated, while still retaining the horizontal orientation shown in FIG. 2, such that the angle between the sheet die center line 50 and the moving carrier 20 at the self-lamination point 24 is between 0° and 180°. Preferably, the sheet die opening 16 is as close as possible to the lamination point 24, e.g., ⅛–3.0 inches.

Regardless of whether the die 14 is horizontal or not, a preferred laminating angle between the sheet die center plane 50 and moving carrier 20 (when measured at the self-lamination point 24 in the direction of polymer sheet 18 travel) is in the range of about 90°–135° (±5°), the most preferred angle of lamination being one which is substantially perpendicular.

At the point of self-lamination 24, therefore, the carrier 20 and polymer sheet 18 do not travel between two or more rollers that are nipped together by virtue of pressure on immediately opposite sides of the polymer 18 and carrier 20. The positioning of the nip-free cylinder 26 with respect to the sheet die center plane 50 should preferably be such that the cylinder 26 advances the extrudate 18 immediately away from the sheet die opening 16, so as to avoid a build-up of extrudate material, and along a circumferential path 52 (with respect to the cylinder axis 26A).

Thus, in further exemplary methods of the invention, the use of the carrier-conveying nip-free cylinder 26 enables self-lamination of the photocurable polymer sheet 18 to occur by moving or conveying the carrier 20 in a direction (such as indicated at 52) increasingly angled away from the initial angle (dotted-line designated at 54) at the first laminating contact 24 between the polymer sheet 18 and moving carrier 20. This increasing angle facilitates the formation of a full laminating contact (i.e., bonding at substantially all points of contact) between the melted polymer sheet 18 and moving carrier 20, whereby the occurrence of air pockets or bubbles therebetween are minimized, since the circumferential path 52 causes a certain force to be exerted against the extruded polymer sheet 18 radially towards the cylinder axis 26A.

The preferred extrusion temperature at the sheet die 14 will depend principally upon the nature of the polymer binder used in the photopolymer extrudate sheet 18, the intended line production speed, the speed of the gear pump 12, the thickness of the extrudate 18, and other factors. Generally, the preferred operating temperature range is about 40°–350° C.; the preferred line speed should be about 1–12 feet or more per minute; and preferred extrudate thicknesses may vary, for example, between 20–300 mils.

In further exemplary methods of the invention; the line speed of the extrudable sheet 18 after self-lamination 24 may be slightly higher than the rate of polymer extrusion through the sheet die 14. In this situation, the extruded sheet width may decrease slightly in the distance between the sheet die opening 16 and the self-lamination point 24 on the moving carrier 20.

Moreover, it sometimes happens that the extrudate sheet edges may form beads or raised portions which may not fully adhere to the moving carrier. These edge beads can be made to adhere to the carrier 20 by a pair of two- or three-inch diameter rollers (not shown) positioned over the sheet edges at a point downstream from the nip-free cylinder 26. In any event, the polymer sheet 18 edges can be removed by edge trimming (not illustrated) after the self-lamination step, preferably at the cutting stage (34 or 42).

In still further exemplary methods of the invention, it is preferable to employ a sheet die 14 having thermally adjustable die bolts along the width of the die to facilitate control over the die lip opening 16, which in turn controls the thickness of the extrudate. In FIG. 2, there is shown an exemplary sheet die 14 comprising a flexible die lip 70 which is attached to lip adjusting bolts 72 on which are attached bolt heater blocks 74 having lip adjusting bolt heaters 76 and air cooling channels 78. A choker bar adjusting bolt 80 is used for major flow adjustments within the die 14. Extrusion dies having such adjustable die bolts are commercially available, for example, from Extrusion Dies, Inc. of Chippewa Falls, Wis., under the tradenames AUTOFLEX™ or ULTRAFLEX™. Dies sold under the designation "HR75" are believed to be suitable for the nip-free self-lamination purposes disclosed herein. Such dies are available in a number of sheet die widths, including 33 and 58 inch widths, or possibly wider.

A microprocessor-based controller 60 (represented in block diagram in FIG. 1) can be used for controlling power level to the lip adjusting die bolt heaters 76 which in mm alter the length of the bolts 72 and the die opening 16. The control of thermal changes of die bolt length provides thickness control in a manner that avoids reliance upon the use of screw-threaded die bolts.

The use of thermally controlled die bolts also facilitates the use of a controller loop system, in further exemplary methods of the invention, wherein a non-contact sensor 27 (see FIG. 1) output corresponding to the thickness of the polymeric sheet 18 (measured in cross-direction) can be correlated with a predetermined thickness profile and/or profile variation range information in a microprocessor controller 60 (FIG. 1), which, in response thereto, can then send corrective signals whereby thermal die bolt temperature, and hence the size of the die lip opening 16, is controlled.

An exemplary controller system can also provide for semi-automatic operation, such as where output from the sensor 27 is displayed on a visual monitor to an operator who adjusts or causes adjustment of the sheet die bolts.

It is therefore envisioned that the use of a control mechanism (14/60/27 as shown schematically in FIG. 1) can be used in exemplary methods of the invention to minimize the number of grinding devices 32/34 used downstream, or to eliminate reliance upon them altogether.

As mentioned, a sensor 27, preferably of the non-contacting radiation scanner variety, can be used in an automatic or semi-automatic control system for controlling the thickness and uniformity of the extrudate polymer sheet 18. The sensor device 27 may be connected to a monitor to visualize the thickness profile of the self-laminated polymer layer. A non-contacting sensor 27, such as a beta transmission sensor, is slidably mounted within an O-frame or C-flame assembly downstream (as at 27) of the nip-free cylinder 26 and is moved back and forth across the direction of web travel. Preferably, the sensor 27 scans the width of the extruded polymer sheet for every rotation of the cylinder 26. The O-flame or C-frame can also be angled with respect to the direction of the carrier 20 travel and the sensor 27 sweep rate can be adjusted so that the width profile can be obtained along a line that is perpendicular to the direction in which the moving web 20 is travelling. Suitable sensors are available from LFE Corporation of Clinton, Mass., under the tradename "PROFITMASTER."

Known photocurable polymer mixtures, or so-called photosensitive or photopolymerizable materials, are suitable for use in the present invention. For example, European Patent Application 0-456-336-A2 of Goss et at. (published Nov. 13,1991), incorporated by reference herein, describes photocurable polymer mixtures suitable for manufacturing exemplary polymer sheets 18.

Another exemplary photocurable polymer composition believed to be suitable for use in the invention is taught in U.S. Pat. No. 5,223,375 of Berrier et at. (W. R. Grace & Co.-Conn.) incorporated herein by reference. Berrier et al. disclose formulations comprising triblock polymers of poly (vinylpyridine)-poly(butadiene) or poly(isoprene)-poly (vinylpyridine). Such polymers may be quaternized, permitting plates that are made with these polymers to be developed in aqueous solutions after imaging with actinic radiation.

Block copolymer photocurable mixtures which are also believed to be suitable for the purposes herein are also disclosed in U.S. Pat. No. 3,867,153 of MacLahan; U.S. Pat. Nos. 4,264,705 and 4,265,986 of Allen; U.S. Pat. Nos. 4,323,636, 4,323,637, 4,369,246, and 4,423,135 of Chen et at., and U.S. Pat. No. 3,265,765 (and counterpart British Patent No. 1,000,900) of Holden et al.; and British Patent No. 1,366,769 of Dupont, all incorporated herein by reference. See also U.S. Pat. No. 4,320,188 of Heinz et al.; U.S. Pat. Nos. 4,427,759 and 4,460,675 of Gruetzmacher et al.; and U.S. Pat. No. 4,622,088 of Min; U.S. Pat. No. 5,135,827 of Bohm et at., all of which are incorporated herein by reference.

Generally, the photocurable composition should comprise an elastomer compound such as a block copolymer (styrene-isoprene-styrene block copolymers being most preferred); an ethylenically unsaturated compound having at least one terminal ethylenic group and preferably at least two or more ethylenic groups; and an organic, radiation-sensitive, free-radical generator photoinitiator or photoinitiator system, such as a dye, all of which are known in the art.

The block copolymer compound should preferably have a number average molecular weight between 25,000 and 1,000,000 and a glass transition temperature below about 10° C.

Other typical block copolymers useful in this invention are polystyrene-polybutadiene-polystyrene and polystyrene-polyisoprene-polystyrene block copolymers which have been hydrogenated according to the teachings of Jones, U.S. Pat. No. 3,431,323 and Hefele et at., U.S Pat. No. 3,333,024. The hydrogenated block copolymers have the additional advantage of improved thermal and oxidative resistance. However, some residual unsaturation in hydrogenated block copolymers is desirable, since only very small concentrations of monomer are then needed in the photosensitive compositions to reduce solvent solubility upon exposure to actinic radiation. Still other typical block-copolymers useful in this invention are those wherein the terminal blocks are polyalkyl styrenes, e.g., poly(alpha-methyl styrene)-polyisoprene-poly-(alpha-methyl styrene), and those composed of a plurality of polymer blocks, e.g., polyisoprene-polystyrene-polybutadiene-polystyrene-polyisoprene.

Other elastomeric binders which are useful in the photopolymer compositions include: polymers of 1,3-butadiene, hydrocarbon- and halogen-substituted 1,3-butadiene, copolymers of 1,3-butadiene monomers with acrylic, alkylacrylic acids or the corresponding esters and/or nitriles, copolymers of 1,3-butadienes with aryl olefins, e.g., styrene, divinyl benzene, etc. Other elastomeric polymers are useful, e.g., polyurethanes, carbonated polyvinyl alcohol, etc. Examples of such elastomeric polymeric binders are disclosed in Canadian Patent No. 614,181 and U.S. Pat. Nos. 2,948,611, 4,177,074, 4,247,624, and 4,272,608, hereby incorporated by reference.

The carrier 20 may comprise any material of thickness suitable for permitting the photopolymer to be melt-extruded onto its surface. Preferably, the carrier is a flexible film or sheet, such as a polyethylene, polyester, or polyethylene terephthalate film or other plastic film, optionally having an additional release layer, such as a polyamide or silicone coating, disposed on the face of the carrier 20 that will be adjacent the extruded photopolymer layer 18.

In further exemplary methods of the invention, the carrier 20 comprises a so-called multi-layer cover element comprising a flexible-polymeric film (such as 2–7 mil polyester film) subcoated with a release coating (such as a 0.05–0.5 mil polyamide coating) which is, in turn, coated with a layer of an elastomeric composition which is photocurable during or after lamination to the photopolymer 18 extruded through the sheet die 20. See e.g., U.S. Pat. No. 4,427,759 of Greutzmacher et al. at Col. 8, ll. 3–8, incorporated herein by reference. During exemplary self-lamination steps of the invention, as described herein and above, the extruded photocurable polymer sheet 18 is self-laminated (as shown at 24 in FIG. 2) to the exemplary multilayer cover element photocurable sheet carrier 20; and the photocurable sheets become bonded together during cooling (See e.g., 30/31). Both the extruded photocurable polymer sheet 18 and cover element 20 photopolymer are subsequently imaged together (not shown) after the flexible polymeric film (applied as part of the exemplary multi-layer cover element) is peeled off the resultant printing plate laminate.

The photocurable layer on the exemplary flexible multilayer cover sheet (carrier) 20 described above preferably contains an elastomer having a modulus which, in a polymerized state, is not substantially less than the elastic modulus of the extruded photocurable sheet layer 18.

The elastomeric composition in exemplary multi-layer cover elements 20 generally contains an elastomeric material which is the same as or similar to the elastomeric binder present in the photopolymer layer 18. Different type elastomeric binders can be used in the elastomeric composition and photopolymer layers provided that the layer of elastomeric composition and photopolymeric layer have an elastic modulus as decribed above. Suitable elastomeric polymers have been described previously above in conjunction with the photopolymer composition. Additional components present in the elastomeric coating composition include a coating solvent, optionally a second binder which can be a nonelastomeric polymer, optionally but preferably a nonmigrating dye or pigment which provides a contrasting color with any colorant, e.g. dye, present in the photopolymeric layer, and optionally one or more ethylenically unsaturated monomeric compounds and/or a photoinitiator or photoinitiator system, and optionally anti-blocking agents. These additional components are known in the art.

Exemplary multi-layer cover sheets 20, comprising a plastic carrier sheet, a photocurable polymer (containing a contrast dye as described above, and a release coating (e.g., polyamide) for allowing removal of the carrier sheet from the polymer after it is photocured, may be continuously fed from a sheet roll 22. The photocurable polymer can be prevented from sticking to the backside of the carrier sheet by using a separate silicone release sheet, which is removed as the sheet is unrolled from the roller 22, or by providing a silicone release coating to the back of the sheet.

In further exemplary embodiments of the invention, the color-contrasting photocurable elastomer, as described above, can be co-extruded at the same time that the photocurable elastomer 18 is extruded, and both may be laminated to the moving carrier 20 (which in this case would comprise preferably a plastic sheet having a release coating) in the nip-free manner described herein. For example, two separate sheet dies can be used at the same nip-free cylinder 26 or apart from each other as successive stages.

Further exemplary methods of the invention comprise a step wherein the photocurable polymer 18 is coextruded with a second photocurable polymer onto the carrier 20. Devices such as coextursion feed blocks, which permit two or more polymers to be fed to an extrusion die, are well-known in the art. See e.g., U.S. Pat. No. 4,622,088 of Min, incorporated herein by reference. Multi-manifold sheet dies are also known which can be used in the exemplary coextrusion process step. Multi-manifold external combining dies, for example, may have completely separate manifolds for different polymer melt streams, as well as distinct lip openings through which the streams leave the die separately, joining just beyond the die opening.

In further exemplary methods, therefore, the photocurable polymer layer 18 is coextruded with a compatible second photocurable polymer having a dye or colorant to provide image contrast properties during development of the printing plate.

In still further exemplary methods, the polymer sheet 18 can be extruded using dies in which one of the lips is recessed. For example, a sheet die 14 having an upper recessed lip is believed to be particularly useful for extruding the polymer sheet 18 to the carrier at a lamination point that occurs on the bottom of the exemplary cylinder 26, as shown in FIG. 1.

Also, a sheet die 14 having a lower recessed lip would be useful for extruding a polymer sheet 18 to the carrier near the top of the cylinder 26 or onto the carrier running horizontally between cylinders or rollers. If a die having a recessed lip is used, the sheet die center plane 50 would be said for present purposes to be defined by the portion of the lips which are coextensive.

In further exemplary methods, it is contemplated that materials described above for use as the base sheet 38 can be used in place of the carrier 20 pulled from roller 22, and that materials described above for use as the carrier 20 can be applied to the photopolymer downstream, as at 36, although this reversal of operations is less preferred.

The viscosity or consistency of the photocurable polymer 18 being extruded from the sheet die 14 should preferably be such that the polymer retains a sheet form shortly after the self-lamination point 24 (see FIG. 2). In addition, the polymer should also exhibit slight "drooping" in the distance between the sheet die opening 16 and moving carrier 20, a distance which is preferably as short as possible. Optionally, a vacuum box or slit can be positioned beneath the extrudate 18 near the point of self-lamination 24 to ensure full adherence of the extrudate 18 to the moving carrier 20 and to minimize entrapment of air therebetween, but this is not deemed necessary.

Figure 3:
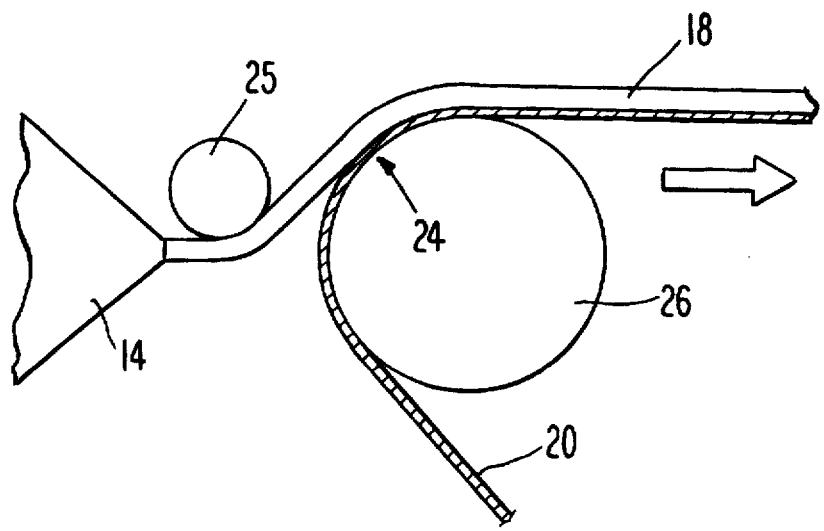
Figure 4:
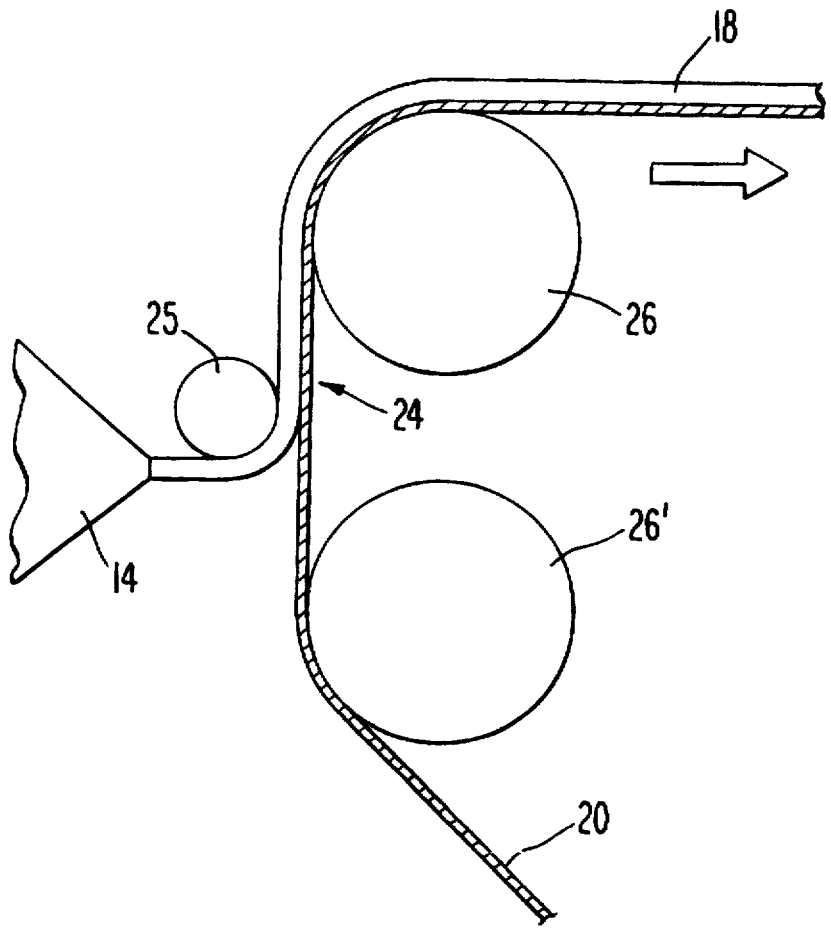
Figure 5:
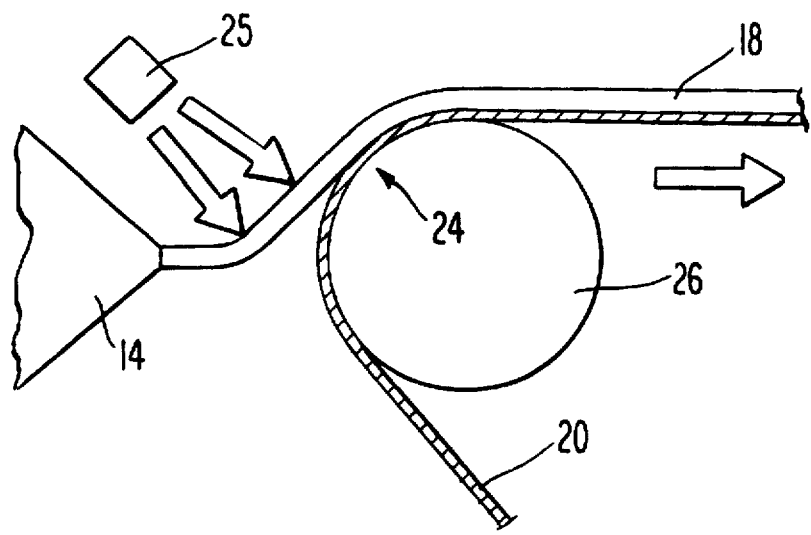
Figure 6:
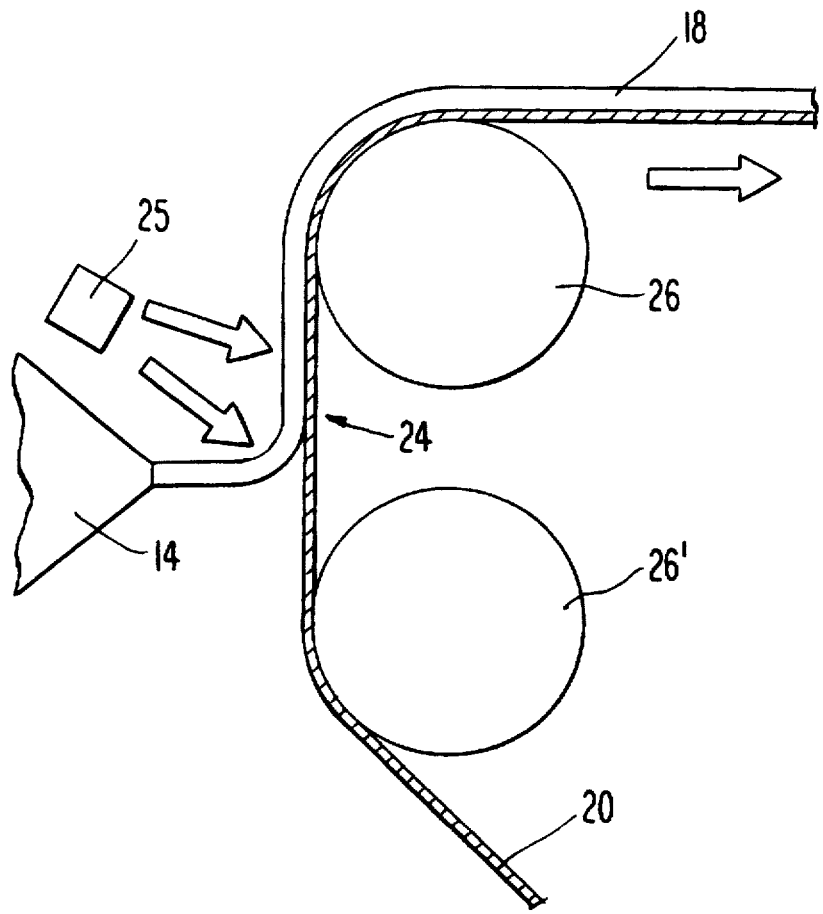

FIG. 3 is a partial diagram of another exemplary method of the invention wherein the photocurable polymer sheet 18 is self-laminated onto the carrier 20 using a nip-free cylinder 26 and a transfer roller 25. The purpose of the optional transfer roller 25 is to guide the extruded sheet 18 to a particular lamination point 24 on the cylinder 26. In FIG. 4 there is shown a further exemplary method in which a transfer roller 25 is used for guiding the extruded sheet 18 to a lamination point 24 on the carrier 20 using a pair of nip-free cylinders 26 and 26'. FIGS. 5 and 6 are similar to FIGS. 3 and 4 but show further exemplary methods of the invention wherein an air stream or air knife 25 is used for laminating the extruded photopolymer sheet 18 to the moving carrier 20 in a nip-free manner.

FIG. 7 shows a further exemplary method of the invention wherein the photocurable polymer sheet 18 is extruded and self-laminated in a nip-free manner onto a moving carrier 20 which can be conveyed flat, either horizontally or angle with respect to the ground, using an air knife 25 to facilitate attachment of the extrudate 18 to the carrier. The carrier may be moving between two rollers or across a relatively slip-free surface, such as polished steel, at the point of self-lamination 24. FIG. 8 shows a further exemplary nip-free self-lamination step wherein the photopolymer sheet 18 is extruded onto the moving carrier 20 using at least three rollers 26, which can be arranged non-linearly to provide a non-linear path whereby additional force is generated to laminate the sheet 18 to the carrier 20. Optionally, one or more air knifes 25 can be used for nip-free lamination.

It is further believed that the nip-free self-lamination methods of the invention are applicable to laminates comprising polymers which are not photocurable. Accordingly, a further exemplary method of the invention comprises the steps of: extruding a molten polymer sheet having major faces extending continuously and coextensively in a portion of the sheet width between opposite sheet edges; and moving a carrier web at a location subsequent to the point of extrusion such that a major face of the extruded polymer sheet, while in a molten state, is self-laminated continuously and directly in a nip-free manner to the moving carrier.

As modifications of the foregoing examples and embodiments may be evident to those skilled in the art in view of the disclosures herein, the scope of the invention is intended to be limited only by the appended claims.

It is claimed:

1. A method for manufacturing a printing element, comprising the steps of:
   providing a sheet die having a continuous lip opening and bolts for controlling the die lip opening, whereby the thickness of an extruded polymeric sheet can be controlled;
   extruding a molten polymer sheet which is or will become photocurable in that portions thereof can be cured when subjected to light or other radiation of an appropriate wavelength, said photocurable polymer comprising an elastomer compound, an ethylenically unsaturated compound having at least one terminal ethylenic group, and a photoinitiator, the sheet having major faces extending continuously and coextensively in a portion of the sheet width between opposite sheet edges;
   moving a carrier web at a location subsequent to the point of extrusion such that a major face of the extended polymer sheet, while in a molten state, is self-laminated continuously and directly in a nip-free manner to the moving carrier; and
   attaching a base sheet to the photocurable polymer sheet.

2. The method of claim 1 further comprising the step of providing a sheet die having a die opening defining a center plane, and said step of, extruding further comprises positioning the sheet die center plane at an angle that is 0°–180° with respect to the carrier moving away from the initial point of self-lamination.

3. The method of claim 2 wherein said angle is 90°–135° between said sheet die center plane and the carrier moving away from the initial point of self-lamination.

4. The method of claim 2 wherein said photocurable layer is being self-laminated to said moving carrier moving away from the point of self-lamination, for at least a certain distance after the initial point of self-lamination, in a direction increasing in angle away from the initial angle at which self-lamination occurs.

5. The method of claim 4 wherein the carrier is moved upon a rotating cylinder, and said molten polymer sheet is extruded onto said carrier while said web is being moved upon said rotating cylinder.

6. The method of claim 5 further comprising the step of cooling the self-laminated extruded photocurable polymer sheet.

7. The method of claim 6 wherein said cooling step comprises the use of forced air or conductive cooling.

8. The method of claim 6 further comprising the step of grinding the photocurable polymer sheet at least once after the sheet has cooled.

9. The method of claim 1 wherein said sheet die further comprises thermally adjustable lip adjusting bolts and lip adjusting bolt heaters operative to adjust the die opening.

10. The method of claim 9 further comprising the step of measuring the thickness of the photocurable polymer sheet after self-lamination of the sheet to the moving carrier.

11. The method of claim 10 further comprising the step of providing a sensor operative to generate an output signal corresponding to the thickness of the self-laminated photocurable polymer sheet.

12. The method of claim 11 further comprising the step of providing a monitor that displays a visual profile corresponding to the output signal of the sensor.

13. The method of claim 11 further comprising the step of providing a controller operative to adjust power levels to the lip adjusting bolt heaters in response to output signals from the sensor.

14. The method of claim 13 further comprising the step of providing an air knife to facilitate said self-lamination.

15. A method for manufacturing a printing element, comprising the steps of:
- providing a sheet die having a continuous lip opening and thermally controlled die bolts for controlling the die lip opening, whereby the thickness of an extruded polymeric sheet can be controlled;
- providing a non-contact sensor which provides an output corresponding to the thickness of a polymeric sheet extruded from the sheet die and a microprocessor-based controller responsive to the output of the non-contact sensor, said controller operative to correlate the sensor output with a predetermined thickness and send signals whereby the thermal die bolt temperature, and hence the size of the die lip opening, is controlled;
- extruding through the die lip opening a molten polymer sheet which is or will become photocurable in that portions thereof can be cured when subjected to light or other radiation of an appropriate wavelength, said photocurable polymer comprising an elastomer compound, an ethylenically unsaturated compound having at least one terminal ethylenic group, and a photoinitiator, the sheet having major faces extending continuously and coextensively in a portion of the sheet width between opposite sheet edges;
- moving a carrier web at a location subsequent to the point of extrusion from the die lip opening such that a major face of the extruded polymer sheet, while in a molten state, is self-laminated continuously and directly in a nip-free manner to the moving carrier; and
- attaching a cover element to the polymer sheet.

16. The method of claim 15 further comprising the steps of cooling the extruded polymer sheet and grinding the sheet.

17. A method for manufacturing a printing element, comprising the steps of:
- providing a sheet die having a continuous lip opening, said lip opening defining a center plane;
- extruding a molten polymer sheet which is or will become photocurable, the sheet having major faces extending continuously and coextensively in a portion of the sheet width between opposite sheet edges; and
- moving a carrier web at a location subsequent to the point of extrusion such that a major face of the extruded polymer sheet, while in a molten state, is self-laminated continuously and directly in a nip-free manner to the moving carrier at an initial point of self-lamination;

wherein:
- said sheet die center plane is positioned at an angle that is 90°–135° with respect to said carrier moving away from said initial point of self-lamination; and
- said polymer sheet is self-laminated to said moving carrier moving away from the point of self lamination, for at least a certain distance after the initial point of self-lamination, in a direction increasing in angle away from the initial angle at which self-lamination occurs.

18. The method of claim 17 further comprising the step of cooling the self-laminated extruded polymer sheet.

19. The method of claim 18 wherein said cooling step comprises use of forced air or conductive cooling.

20. The method of claim 18 further comprising the step of grinding the photocurable polymer sheet at lease once after the sheet has cooled.

21. The method of claim 17 further comprising the step of attaching a base sheet to the photocurable polymer sheet.

\* \* \* \* \*